(12) United States Patent
Ota et al.

(10) Patent No.: US 11,132,950 B2
(45) Date of Patent: Sep. 28, 2021

(54) ELECTRO-OPTICAL DEVICE AND ELECTRONIC APPARATUS

(71) Applicant: SEIKO EPSON CORPORATION, Tokyo (JP)

(72) Inventors: Hitoshi Ota, Shiojiri (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/296,694

(22) Filed: Mar. 8, 2019

(65) Prior Publication Data

US 2019/0279572 A1   Sep. 12, 2019

(30) Foreign Application Priority Data

Mar. 9, 2018  (JP) .............................. JP2018-042609

(51) Int. Cl.
| | |
|---|---|
| *G09G 3/3258* | (2016.01) |
| *H01L 27/32* | (2006.01) |
| *H01L 27/12* | (2006.01) |
| *G09G 3/3233* | (2016.01) |
| *G09G 3/325* | (2016.01) |

(52) U.S. Cl.
CPC .......... *G09G 3/3258* (2013.01); *G09G 3/325* (2013.01); *G09G 3/3233* (2013.01); *H01L 27/1255* (2013.01); *H01L 27/3276* (2013.01); *G09G 2310/0251* (2013.01); *G09G 2310/0264* (2013.01)

(58) Field of Classification Search
CPC ......... G09G 3/3258; G09G 2310/0264; G09G 3/3233; G09G 3/325; G09G 2310/0251; H01L 27/3276; H01L 27/1255
See application file for complete search history.

(56) References Cited

U.S. PATENT DOCUMENTS

| | | | |
|---|---|---|---|
| 2012/0138940 A1* | 6/2012 | Sato ..................... | H01L 27/124 257/59 |
| 2013/0207564 A1* | 8/2013 | Ota ....................... | G09G 3/3241 315/224 |
| 2014/0285411 A1* | 9/2014 | Tamura ................ | G09G 3/3208 345/82 |
| 2016/0042692 A1* | 2/2016 | Ota ....................... | G09G 3/3233 345/215 |
| 2016/0322450 A1* | 11/2016 | Lee ..................... | H01L 27/3265 |
| 2020/0035156 A1* | 1/2020 | Yanase ................ | H01L 27/3276 |
| 2020/0051504 A1* | 2/2020 | Ota ....................... | G09G 3/3275 |
| 2020/0051510 A1* | 2/2020 | Ota ....................... | G09G 3/3233 |

FOREIGN PATENT DOCUMENTS

| | | |
|---|---|---|
| JP | 2012-119532 A | 6/2012 |
| JP | 2016-38425 A | 3/2016 |

* cited by examiner

*Primary Examiner* — Amare Mengistu
*Assistant Examiner* — Jennifer L Zubajlo
(74) *Attorney, Agent, or Firm* — Oliff PLC

(57) ABSTRACT

Provided is an electro-optical device including a display region including a pixel circuit and a data line corresponding to the pixel circuit, a data line drive circuit configured to output a gradation voltage, and a first capacitor configured to hold a gradation voltage output from the data line drive circuit, and the capacitor is provided in the display region.

14 Claims, 11 Drawing Sheets

ELECTRO-OPTICAL DEVICE AND ELECTRONIC APPARATUS

BACKGROUND

1. Technical Field

The invention relates to an electro-optical device and an electronic apparatus.

2. Related Art

In recent years, various types of electro-optical devices using light-emitting elements such as organic light-emitting diode (hereinafter referred to as an Organic Light Emitting Diode (OLED)) elements have been proposed. In an electro-optical device of the related art, a pixel circuit including a light-emitting element and a drive transistor is provided corresponding to an intersection between a scanning line and a data line. JP-A-2016-38425 discloses a drive circuit suitable for driving a miniaturized pixel circuit.

In the technology disclosed in JP-A-2016-38425, a holding capacitor configured to hold a gradation voltage to be output to a data line is provided in the drive circuit. Accordingly, the holding capacitor is disposed in a portion other than a display region in the electro-optical device where the pixel circuit is disposed.

However, in the technology disclosed in JP-A-2016-38425, since the holding capacitor is provided in the portion other than the display region, there has been an issue such as enlargement of the portion other than the display region.

SUMMARY

To address the above issue, an electro-optical device according to an aspect of the invention includes a display region including a pixel circuit and a data line corresponding to the pixel circuit, a data line drive circuit configured to output a gradation voltage commensurate with a display gradation of the pixel circuit to the data line, and a first capacitor configured to hold a gradation voltage output from the data line drive circuit, wherein the first capacitor is provided in the display region.

According to the above aspect, the first capacitor serving as a holding capacitor configured to hold a gradation voltage is provided in the display region. Thus, according to the above aspect, area of a portion other than the display region in the electro-optical device can be reduced, as compared to the related art in which a holding capacitor is provided only in a portion other than a display region. Note that, in a case where the first capacitor alone insufficiently serves as a holding capacitor, a capacitor serving as a holding capacitor together with the first capacitor may be provided in the portion other than the display region. Even in such an aspect, the area of the portion other than the display region in the electro-optical device can be reduced, as compared to the related art in which the holding capacitor is provided only in the portion other than the display region.

The electro-optical device may be configured in which in the display region, a first wiring and a fixed potential line to which a fixed potential is applied may be provided along the data line, and the first capacitor includes a capacitor provided between the fixed potential line and the first wiring.

According to the above aspect, since an inter-wiring capacitor formed between the fixed potential line and the first wiring serves as the first capacitor, it is unnecessary to separately provide a capacitor element serving as the first capacitor between the fixed potential line and the first wiring in the display region. Moreover, since the fixed potential line and the first wiring can be added to form the first capacitor, area of the display region can be reduced, as compared to a case where the first capacitor is separately formed in the display region without the addition of the fixed potential line and the first wiring.

The electro-optical device may include a light-emitting element layer in which a light-emitting element is formed, a circuit layer to which the pixel circuit is formed, a first metal layer which is provided further toward the light-emitting element layer side than the circuit layer, and a first wiring layer which is provided further toward the light-emitting element layer side than the first metal layer, and in which the first wiring is formed, and in the electro-optical device, the first capacitor may include a capacitor formed between the first metal layer and the first wiring.

According to the above aspect, the capacitor formed between the first metal layer and the first wiring serves as the first capacitor. Since the first metal layer and the first wiring layer formed with the first wiring are layered one on another, it is unnecessary to increase the area of the display region to form the first capacitor, and miniaturization of the display region is readily achieved.

The electro-optical device may be configured in which a fixed potential line to which a fixed potential is applied is formed in the first wiring layer, and the first capacitor includes a capacitor formed between the first metal layer and the first wiring and a capacitor formed between the fixed potential line and the first wiring.

According to the above aspect, since an inter-wiring capacitor formed between the fixed potential line and the first wiring and an inter-wiring capacitor formed between the first metal layer and the first wiring both serve as the first capacitor, a holding capacitor having a sufficient size can be provided in the display region. Thus, according to the above aspect, it is unnecessary to provide a capacitor serving as a holding capacitor together with the first capacitor in the portion other than the display region, and the area of the portion other than the display region in the electro-optical device can be reduced, as compared to an aspect in which a capacitor serving as a holding capacitor together with the first capacitor is provided in the portion other than the display region.

The electro-optical device may be configured in which the data line drive circuit includes a switch coupled to the first wiring, a second wiring layer and a second metal layer to which a fixed potential is applied are provided between the circuit layer and the first metal layer, the second wiring layer includes the data line, and a second wiring coupled via the switch to the first wiring, which are formed side by side, and a second capacitor formed of the data line and the second wiring is provided.

According to the above aspect, the second capacitor serves as a transfer capacitor to which the gradation voltage held in the holding capacitor is transferred, and the pixel circuit can perform coupling drive. That is, according to the above aspect, in the electro-optical device in which coupling drive is performed, the area of the portion other than the display region can be reduced, as compared to the related art. Moreover, according to the above aspect, the data line can be shielded electrostatically by the first metal layer and the second metal layer.

Moreover, in addition to the electro-optical device, the invention can be conceived as an electronic apparatus including the electro-optical device. A typical example of the electronic apparatus includes a display device such as a head-mounted display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, modes for carrying out the invention will be described with reference to accompanying drawings. However, in each figure, a size and a scale of each unit is different from the actual size and the actual scale of each unit as appropriate. Moreover, exemplary embodiments described below are suitable specific examples of the invention, and various technically preferable limitations are applied, but the scope of the invention is not limited to these modes unless it is specifically described in the following description to limit the invention.

A. Exemplary Embodiment

Figure 1:
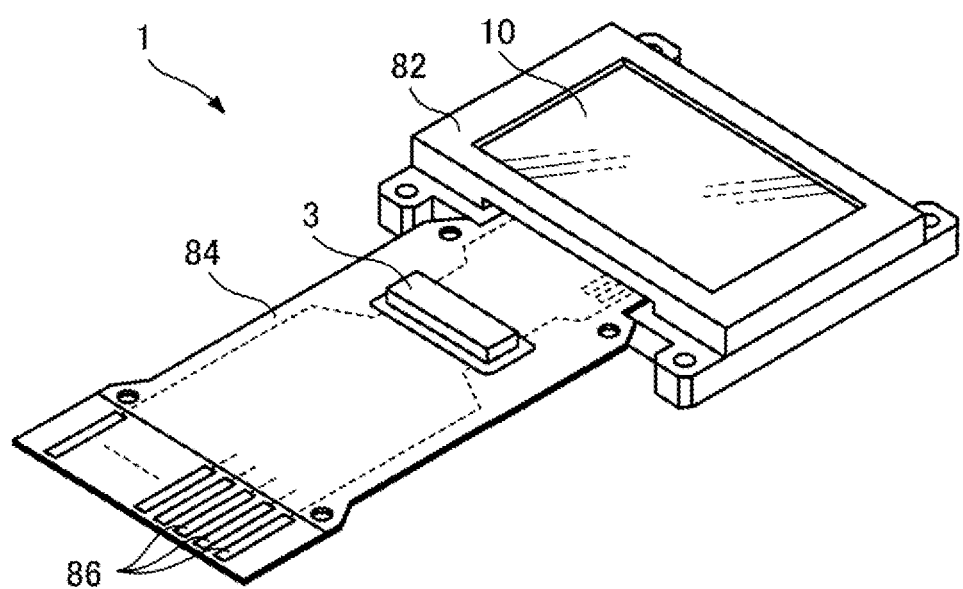
FIG. 1 is a perspective view illustrating a configuration of an electro-optical device 1 according to an exemplary embodiment of the invention.

FIG. 1 is a perspective view illustrating a configuration of an electro-optical device 1 according to an exemplary embodiment of the invention. The electro-optical device 1 serves as a micro display configured to display an image in a head-mounted display, for example.

As illustrated in FIG. 1, the electro-optical device 1 includes a display panel 10 and a control circuit 3 configured to control an operation of the display panel 10. The display panel 10 includes a plurality of pixel circuits, and a drive circuit configured to drive the pixel circuits. In the exemplary embodiment, the plurality of pixel circuits and the drive circuit provided in the display panel 10 are formed in a silicon substrate, and an OLED being an example of an electro-optical element is used in each of the pixel circuits. Moreover, for example, the display panel 10 is housed in a frame-shaped case 82 opened at a display unit, and is coupled with one end of a Flexible Printed Circuits (FPC) substrate 84. A control circuit 3 of a semiconductor chip is mounted on the FPC substrate 84 by a Chip On Film (COF) method, and a plurality of terminals 86 are provided to be coupled to an upper circuit (not illustrated).

Figure 2:
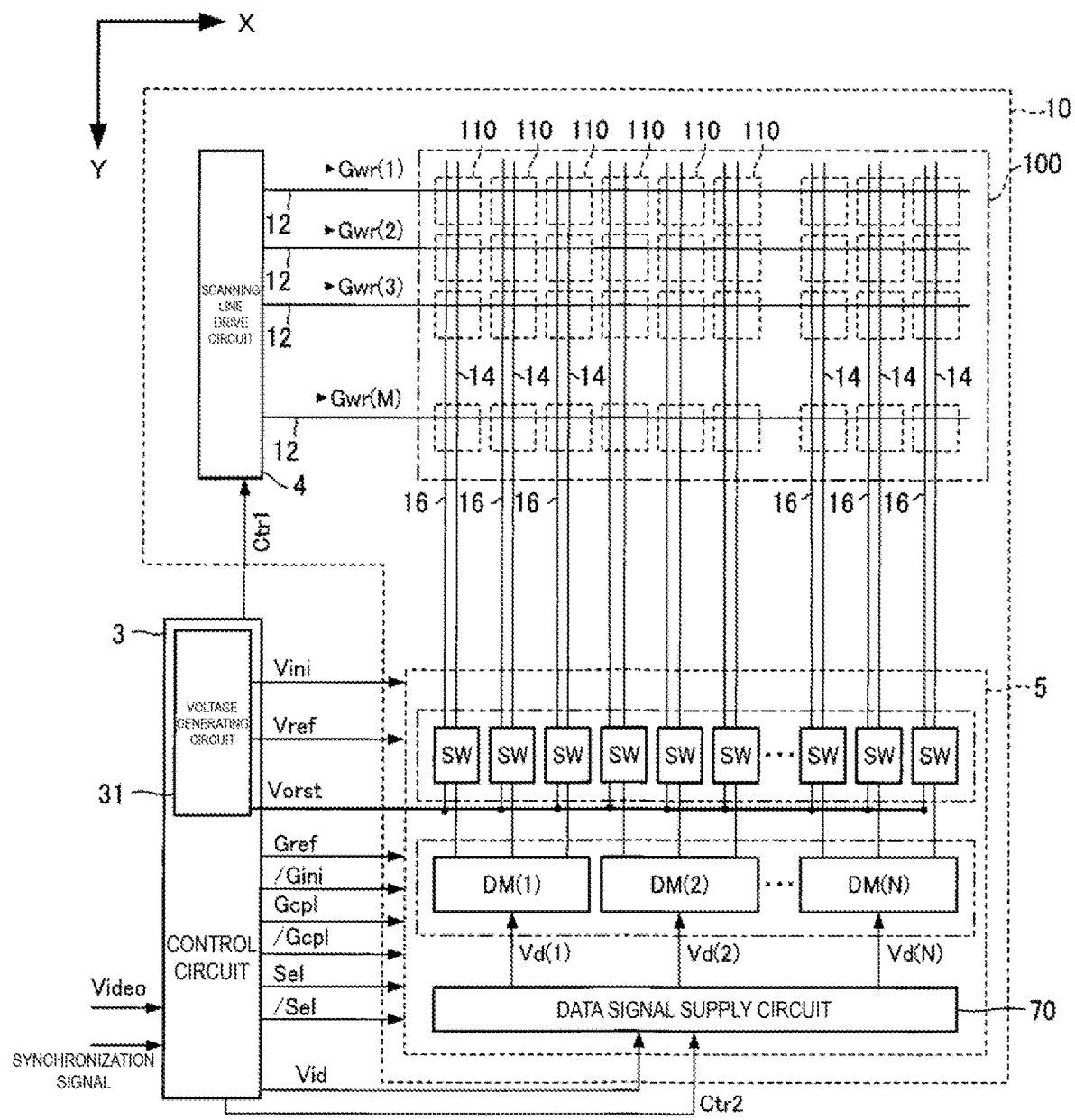
FIG. 2 is a diagram illustrating an electrical configuration of the electro-optical device 1.

FIG. 2 is a block diagram illustrating a configuration of the electro-optical device 1 according to the exemplary embodiment. As described above, the electro-optical device 1 includes the display panel 10 and the control circuit 3. To the control circuit 3, image data Video being digital image data is supplied from the upper circuit (not illustrated) synchronously with a synchronization signal. Here, the image data Video means data defining a display gradation of a pixel of an image to be displayed on the display panel 10 (precisely, a display unit 100 described below) by, for example, 8 bits. Moreover, the synchronization signal means a signal including a vertical synchronization signal, a horizontal synchronization signal, and a dot clock signal.

The control circuit 3 generates various control signals, based on the synchronization signal, and supplies the control signals to the display panel 10. Specifically, the control circuit 3 supplies control signals Ctr1 to Ctr2, Gref, /Gini, Gcp1, /Gcp1, Sel(1), Sel(2), Sel(3), /Sel(1), /Sel(2), and/ Sel(3) to the display panel 10. Each of the control signals Ctr1 and Ctr2 is a signal including a plurality of signals such as a pulse signal, a clock signal, and an enable signal. The control signal Gref is a control signal of positive logic, and the control signal/Gini is a control signal of negative logic. The control signal Gcp1 is also a control signal of positive logic, and the control signal/Gcp1 is a control signal of negative logic having a relationship of logic inversion with the control signal Gcp1. The control signal /Sel(1) has a relationship of logic inversion with the control signal Sel1 (1). Similarly, the control signal/Sel(2) has a relationship of logic inversion with the control signal Sel(2), and the control signal/Sel(3) has a relationship of logic inversion with the control signal Sel(3). Note that the control signals Sel(1), Sel(2), and Sel(3) are generally referred to as a control signal Sel, and the control signals/Sel(1), /Sel(2), and/Sel(3) are generally referred to as a control signal/Sel. A voltage generating circuit 31 receives power from a power supply circuit (not illustrated), and supplies a reset potential Vorst, a reference potential Vref, an initial potential Vini, and the like to the display panel 10.

Further, the control circuit 3 generates an analog image signal Vid, based on the image data Video. Specifically, the control circuit 3 is provided with a lookup table associating and storing a potential indicated by the image signal Vid and brightness of the electro-optical element provided in the display panel 10. Then, the control circuit 3 generates the image signal Vid indicating the potential corresponding to the brightness of the electro-optical element defined by the image data Video with reference to the lookup table, and supplies the image signal Vid to the display panel 10.

As illustrated in FIG. 2, the display panel 10 includes the display unit 100, and a drive circuit (a scanning line drive circuit 4 and a data line drive circuit 5) configured to drive the display unit 100. In this embodiment, the drive circuit is divided into the scanning line drive circuit 4 and the data line drive circuit 5, but these circuits may be integrated into a single circuit to constitute the drive circuit. As illustrated in FIG. 2, the display unit 100 includes pixel circuits 110 arranged in a matrix pattern, and corresponding to pixels of an image to be displayed. Although detailed illustration is omitted in FIG. 2, the display unit 100 is provided with M rows of scanning lines 12 extending in a horizontal direction (X direction) in the figure, and is also provided with (3N) columns of data lines 14 grouped into each set of three columns and extending in a vertical direction (Y direction) in the figure. Each of the scanning lines 12 and each of the data lines 14 are provided to maintain mutual electrical insulation. The pixel circuits 110 are provided corresponding to intersections between the M rows of scanning lines 12 and the (3N) columns of data lines 14. Thus, in the exemplary embodiment, the pixel circuits 110 are arranged in a matrix pattern including M rows vertically and (3N) columns horizontally.

Here, each of M and N is a natural number. To distinguish the rows from each other in the scanning lines 12 and the matrix of the pixel circuits 110, the rows may be referred to as rows 1, 2, 3, . . . , (M−1), and M sequentially from the top in the figure. Similarly, to distinguish the columns from each other in the data lines 14 and the matrix of the pixel circuits 110, the columns may be referred to as columns 1, 2, 3, . . . , (3N−1), and (3N) sequentially from the left in the figure. Here, to generalize and describe a group of the data lines 14, when n represents any integer of 1 or greater, the data lines 14 of columns (3n−2), (3n−1), and (3n) belong to a group n, as counting from the left. The three pixel circuits 110 corresponding to the scanning line 12 of the same row and three columns of the data lines 14 belonging to the same group respectively correspond to R (red), G (green), and B (blue) pixels, and these three pixels represent one dot of a color image to be displayed. That is, in the exemplary embodiment, a color of one dot is represented with an additive color mixture by light emission of the OLED corresponding to RGB.

Moreover, as illustrated in FIG. 2, the display unit 100 is provided with (3N) columns of feed lines 16 extending along the data lines 14. Each of the (3N) columns of feed lines 16 is provided to extend in the vertical direction, and to maintain mutual electrical insulation with each of the scanning lines 12. Each of the feed lines 16 is a fixed potential line supplied with a predetermined reset potential Vorst in common from the voltage generating circuit 31. To distinguish the columns of the feed lines 16 from each other, the columns are referred to as the feed lines 16 of columns 1, 2, 3, . . . , and (3N) sequentially from the left in the figure. Each of the feed lines 16 of columns 1 to (3N) is provided corresponding to each of the data lines 14 of columns 1 to (3N).

The scanning line drive circuit 4 generates scanning signals Gwr for selecting M rows of the scanning lines 12 in a single frame period sequentially row by row, in accordance with the control signal Ctr1. In FIG. 2, the scan signals Gwr supplied to the scanning lines 12 of rows 1, 2, 3, . . . , and M are respectively denoted by Gwr(1), Gwr(2), Gwr(3), . . . , Gwr(M−1), and Gwr(M). Note that the scanning line drive circuit 4 generates, in addition to the scanning signals Gwr(1) to Gwr(M), various types of control signals synchronized with the scanning signals Gwr for each row, and supplies the control signals to the display unit 100; however, such illustration is omitted in FIG. 2. The frame period refers to a period necessary for the electro-optical device 1 to display one cut (frame) of an image. For example, when a frequency of a vertical synchronization signal present in the synchronization signal is 120 Hz, the frame period is 8.3 milliseconds of the one cycle.

As illustrated in FIG. 2, the data line drive circuit 5 includes (3N) switch units SW corresponding to (3N) columns of the data lines 14, respectively in a one-to-one relationship, N demultiplexers DM each provided to each of three columns of the data lines 14 constituting each group, and a data signal supply circuit 70.

The data signal supply circuit 70 generates data signals Vd(1), Vd(2), . . . , and Vd(N), based on the image signal Vid and the control signal Ctr2 supplied from the control circuit 3. That is, the data signal supply circuit 70 generates the data signals Vd(1), Vd(2), . . . , and Vd(N), based on the image signal Vid obtained by time division multiplexing the data signals Vd(1), Vd(2), . . . , and Vd(N). Then, the data signal supply circuit 70 supplies the data signals Vd(1), Vd(2), . . . , and Vd(N) to the demultiplexers DM corresponding to groups 1, 2, . . . , and N, respectively.

A configuration of the pixel circuit 110, the switch unit SW, and the demultiplexer DM will now be described with reference to FIG. 3. To generally indicate the rows in which the pixel circuits 110 are arranged, m represents any integer of 1 or greater and M or less. Since the pixel circuits 110 are the same as one another in terms of an electrical configuration, here, the pixel circuit 110 of row m, and column (3n) positioned at row m and positioned at column (3n) will be described as an example. The pixel circuit 110 of row m is supplied with the scanning signal Gwr(m) and the control signals Gcmp(m) and Gel(m) from the scanning line drive circuit 4.

Figure 3:
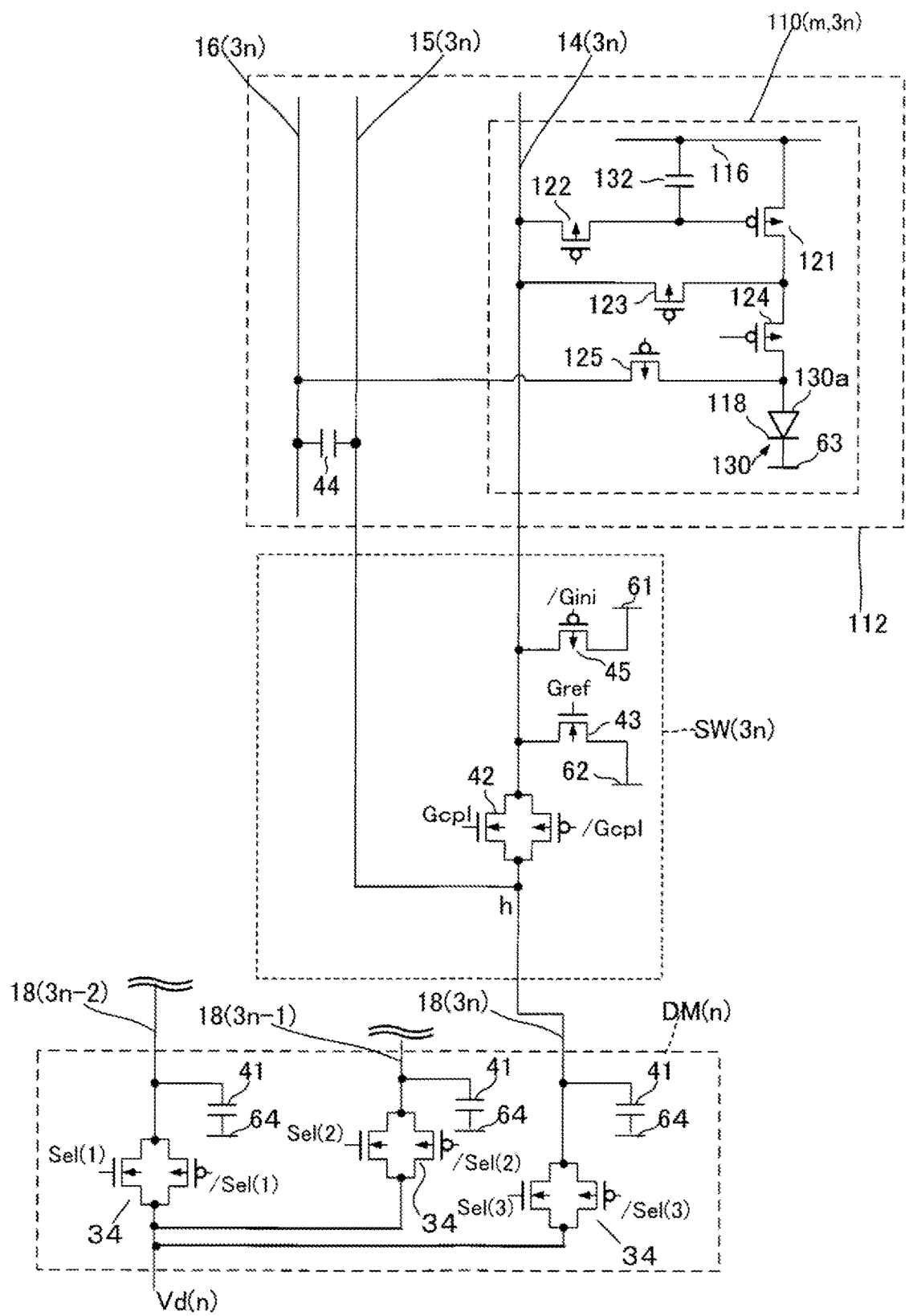
FIG. 3 is a diagram illustrating a configuration example of a pixel circuit 110, a switch unit SW, and a demultiplexer DM.

As illustrated in FIG. 3, a display region 112 of the display unit 100 is provided with the pixel circuit 110, and the data line 14 configured to supply a gradation voltage to the pixel circuit 110. In addition, the display region 112 is provided with the feed line 16 and first wiring 15 for each column along the data line 14. In FIG. 3, the pixel circuit 110 of row m, and column (3n) is denoted by "110(m, 3n)", and the data line 14 of column (3n) is denoted by "14(3n)". In FIG. 3, as with the data line 14, the first wiring 15 of column (3n) is denoted by "15(3n)", and the feed line 16 of column (3n) is denoted by "16(3n)". As illustrated in FIG. 3, any of the data line 14(3n) and the first wiring 15(3n) is coupled to the switch unit SW, and the pixel circuit 110 is coupled to the data line 14(3n). Note that, in FIG. 3, the switch unit SW coupled to the data line 14(3n) is denoted by "SW(3n)", and the demultiplexer DM coupled to the switch unit SW(3n) is denoted by "DM(n)". The pixel circuit 110(m, 3n) includes a first transistor 121, a second transistor 122, a third transistor 123, a fourth transistor 124, and a fifth transistor 125 each being a P-channel MOS-type transistor, an OLEO 130, and a pixel capacitor 132. In the following, the first transistor 121, the second transistor 122, the third transistor 123, the fourth transistor 124, and the fifth transistor 125 may generally be referred to as the transistors 121 to 125.

A gate of the second transistor 122 is electrically coupled to the scanning line 12 (the scanning line 12 of row m in the case of the pixel circuit 110(m, 3n)). Moreover, one of a source and a drain of the second transistor 122 is electrically coupled to the data line 14(3n), and the other is electrically coupled to a gate of the first transistor 121 and one of electrodes of the pixel capacitor 132. The second transistor 122 functions as a switching transistor configured to control electrical coupling between the gate of the first transistor 121 and the data line 14(3n).

A drain of the first transistor 121 is electrically coupled to a feed line 116. A potential Vel being the high-order side of the power source in the pixel circuit 110 is supplied to the feed line 116 from a power supply circuit (not illustrated). The first transistor 121 functions as a drive transistor in which a current commensurate with a voltage between the gate and the source flows to the OLED 130.

One of a source and a drain of the third transistor 123 is electrically coupled to the data line 14(3n), and the other is electrically coupled to a source of the first transistor 121. The control signal Gcmp(m) is provided to a gate of the third transistor 123. The third transistor 123 is a transistor configured to conduct electric current, via the data line 14(3n) and the second transistor 122, between the gate and the source of the first transistor 121. That is, the third transistor 123 functions as a switching transistor configured to control electrical coupling between the gate and the source of the first transistor 121.

A drain of the fourth transistor 124 is electrically coupled to the source of the first transistor 121, and a source of the fourth transistor 124 is electrically coupled to an anode of the OLED 130. The control signal Gel(m) is provided to a gate of the fourth transistor 124. The fourth transistor 124 functions as a switching transistor configured to control electrical coupling between the source of the first transistor 121 and the anode of the OLED 130.

One of a source and a drain of the fifth transistor 125 is electrically coupled to the feed line 16(3n), that is, to a fixed potential line configured to supply the reset potential Vorst, and the other is coupled to the anode of the OLED 130. The control signal Gcmp(m) is supplied to a gate of the fifth transistor 125. The fifth transistor 125 functions as a switching transistor configured to control electrical coupling between the feed line 16(3n) and the anode of the OLED 130.

In the exemplary embodiment, since the display panel 10 is formed on a silicon substrate, a substrate potential of each of the transistors 121 to 125 is assumed to be the potential Ve1. Moreover, the sources and the drains of the transistors 121 to 125 as described above may be reversed in accordance with channel types and potential relationships of the transistors 121 to 125. Moreover, each of the transistors may be a thin film transistor or may be a field effect transistor.

In the pixel capacitor 132, one of electrodes is electrically coupled to the gate of the first transistor 121, and the other is electrically coupled to the feed line 116. Thus, the pixel capacitor 132 functions as a holding capacitor configured to hold a voltage between the gate and the drain of the first transistor 121. Note that, as the pixel capacitor 132, a capacitor parasitic on the gate of the first transistor 121 may be used, and a capacitor formed by sandwiching an insulating layer between mutually different conductive layers in a silicon substrate may be used.

An anode 130a of the OLED 130 is a pixel electrode provided individually for each pixel circuit 110. In contrast, a cathode of the OLED 130 is a common electrode 118 commonly provided across all of the pixel circuits 110, and is coupled to a feed line 63. A potential Vct being a fixed potential is supplied to the feed line 63. Here, the potential Vct may be equivalent to an L level of each of the scanning signal and the control signal being logic signals. The OLED 130 is an element including a white organic electroluminescent (EL) layer sandwiched between the anode 130a of the OLED 130 and the cathode having light permeability of the OLED 130 in the above-described silicon substrate. Then, a color filter corresponding to any of RGB is superimposed on an emission side (cathode side) of the OLED 130. Note that an optical distance between the two reflection layers disposed to sandwich the white organic EL layer may be adjusted to form a cavity structure, and a wavelength of light emitted from the OLED 130 may be set. In this case, a color filter may or may not be provided.

When a current flows from the anode 130a to the cathode (the common electrode 118) of the OLED 130, holes injected from the anode 130a and electrons injected from the cathode are recombined in the organic EL layer to produce excitons, and white light is generated. The white light generated at this time passes through the cathode on the side opposite to the silicon substrate (anode), and the white light is colored by using the color filter, and is visually recognized on the observer side.

As illustrated in FIG. 3, the demultiplexer DM(n) is an assembly of a transmission gate 34 and a capacitor 41 provided for each column, and sequentially supplies data signals to the three columns constituting each group. Input ends of the transmission gates 34 corresponding to columns (3n−2), (3n−1), and 3(n) belonging to group n are mutually coupled in common and the data signal Vd(n) is supplied to each of the common terminals. An output end of the transmission gate 34 corresponding to column (3n) is coupled to an input end of the switch unit SW(3n) via a signal line 18(3n). While detailed illustration is omitted in FIG. 3, an output end of the transmission gate 34 corresponding to column (3n−1) is coupled to an input end of the switch unit SW(3n−1) via a signal line 18(3n−1), and an output end of the transmission gate 34 corresponding to column (3n−2) is coupled to an input end of the switch unit SW(3n−2) via a signal line 18(3n−2).

One of electrodes of the capacitor 41 corresponding to column (3n) is coupled to the signal line 18(3n), and the other electrode of the capacitor 41 corresponding to column (3n) is coupled to a feed line 64. Similarly, one of electrodes of the capacitor 41 corresponding to column (3n−1) is coupled to the signal line 18(3n−1), and one of electrodes of the capacitor 41 corresponding to column (3n−2) is coupled to the signal line 18(3n−2). The other electrode of the capacitor 41 corresponding to column (3n−1) and the other electrode of the capacitor 41 corresponding to column (3n−2) are coupled to the feed line 64. A potential VSS being a fixed potential is supplied to the feed line 64. Here, the potential VSS may be equivalent to the L level of each of the scanning signal and the control signal being logic signals.

The transmission gate 34 provided in column (3n−2) being a left end column in group n is turned on (is conducted) when the control signal Sel(l) is at an H level (when the control signal/Sel(1) is at the L level). Similarly, the transmission gate 34 provided in column (3n−1) being a center column in group n is turned on when the control signal Sel(2) is at the H level (when the control signal/Sel (2) is at the L level), and the transmission gate 34 provided in column (3n) being a right end column in group n is turned on when the control signal Sel(3) is at the H level (when the control signal /Sel(3) is at the L level).

The switch unit SW(3n) includes a transmission gate 42, an N-channel MOS type transistor 43, and a P-channel MOS type transistor 45. In the switch unit SW(3n), an input end of the transmission gate 42 serves as an input end of the switch unit SW(3n). The signal line 18(3n) is coupled to the input end of the transmission gate 42 of the switch unit SW(3n). The first wiring 15(3n) is coupled to a node h in the signal line 18(3n). Accordingly, in the demultiplexer DM(n), one of electrodes of the capacitor 41 corresponding to column 3n is coupled to the first wiring 15(3n) via the signal line 18(3n). The data line 14(3n) is coupled to an output end of the transmission gate 42. The control signal Gcp1 and the control signal/Gcp1 are supplied from the control circuit 3 to the transmission gate 42. The transmission gate 42 is turned on when the control signal Gcp1 is at the H level (when the control signal/Gcp1 is at the L level). When the transmission gate 42 is turned on, the first wiring 15(3n) coupled to the signal line 18(3n) is electrically coupled to the data line 14(3n) in the signal line 18(3n) and the node h.

A drain of the transistor 45 is coupled to the data line 14(3n), and a source of the transistor 45 is coupled to a feed line 61 to which a predetermined initialization potential Vini is supplied. The control circuit 3 supplies the control signal/ Gini to a gate of the transistor 45. In the transistor 45, the data line 14(3n) and the feed line 61 are electrically coupled to each other when the control signal/Gini is at the L level, and are electrically uncoupled when the control signal /Gini is at the H level. When the data line 14(3n) is electrically coupled to the feed line 61, a potential of the data line 14(3n) becomes the initialization potential Vini.

A drain of the transistor 43 is coupled to the data line 14(3n), and a source of the transistor 43 is coupled to a feed line 62 to which the reference potential Vref is supplied. The reference potential Vref is a reference potential used in a compensation operation of compensating a threshold voltage of the drive transistor (that is, the first transistor 121) of the pixel circuit 110. The control signal Gref is supplied to a gate of the transistor 43. In the transistor 43, the data line 14(3n) and the feed line 62 are electrically coupled to each other when the control signal Gref is at the H level, and are electrically uncoupled when the control signal Gref is at the L level. When the data line 14(3n) is electrically coupled to the feed line 62, a potential of the data line 14(3n) becomes the reference potential Vref.

A capacitor 44 in FIG. 3 is an inter-wiring capacitor formed between the feed line 16 and the first wiring 15(3n). When the transmission gate 34 is turned on in a state where the transmission gate 42 is turned off, a data signal Vd(n) is supplied to the signal line 18(3n) from the output end of the transmission gate 34, and a charge commensurate with a gradation voltage indicated by the data signal Vd(n) is accumulated in the capacitor 41 and the capacitor 44. That is, the capacitor 41 and the capacitor 44 of column (3n) each serve as a holding capacitor configured to hold a gradation voltage commensurate with a display gradation of the pixel circuit 110 of column (3n). Then, when the transmission gate 42 is turned on in a state where the gradation voltage is held in the capacitor 41 and the capacitor 44, the signal line 18(3n) and the first wiring 15(3n) are electrically coupled to the data line 14, and the gradation voltage held in the capacitor 41 and the capacitor 44 is supplied to the pixel circuit 110(m, 3n) via the data line 14(3n).

In the exemplary embodiment, the capacitor 41 is provided together with the transmission gate 34, the transmission gate 42, and the transistors 43 and 45 in a portion other than the display region 112 (an outer frame region surrounding the display region 112) in the electro-optical device 1. On the other hand, the capacitor 44 is provided in the display region (that is, the display region 112). As described above, the capacitor 44 of column (3n) is an inter-wiring capacitor formed between the feed line 16(3n) and the first wiring 15(3n), and the feed line 16(3n) and the first wiring 15(3n) are provided side by side in the display region 112 to form the capacitor 44.

Figure 4:
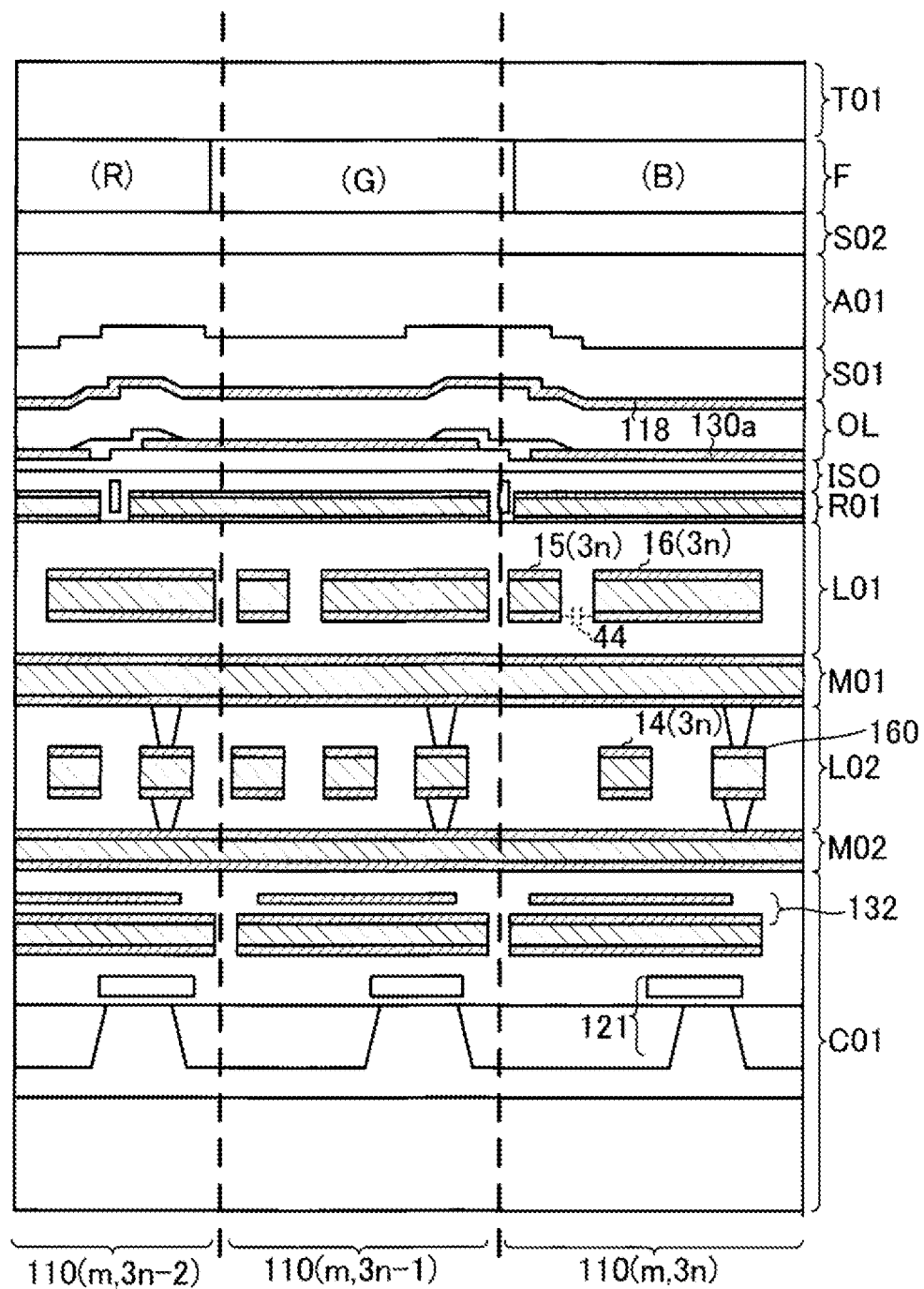
FIG. 4 is a partial cross-sectional view illustrating the display panel 10.

FIG. 4 is a partial cross-sectional view illustrating a cross section of the display unit 100 in a plane passing through the pixel circuits 110(m, 3n-2), 110(m, 3n-1), and 110(m, 3n). As illustrated in FIG. 4, the display unit 100 includes a circuit layer C01, a second metal layer M02, a second wiring layer L02, a first metal layer M01, a first wiring layer L01, a reflective layer R01, an insulation layer ISO, a light-emitting element layer OL, a first sealing layer S01, a planarization layer A01, a second sealing layer S02, a color filter layer F, and a transparent substrate T01 layered one on another.

The transparent substrate T01 is formed of glass or a transparent resin. The color filter layer F is provided with the above-described color filter. The first sealing layer S01 and the second sealing layer S02 are each formed of SiOn. In the light-emitting element layer OL, the OLED 130 is formed. FIG. 4 illustrates the cathode (the common electrode 118) and the anode 130a of the OLED 130. In the circuit layer C01, the transistors 121 to 125 and the pixel capacitor 132 provided in the pixel circuit 110 are formed. In the example illustrated in FIG. 4, the pixel capacitor 132 and a transistor 121 (more precisely, a gate of the transistor 121) are illustrated as an example of a circuit element formed in the circuit layer C01.

As illustrated in FIG. 4, the first metal layer M01 is provided closer to the light-emitting element layer OL side than the circuit layer C01, and the first wiring layer L01 is provided closer to the light-emitting element layer OL side than the first metal layer M01. As illustrated in FIG. 4, the feed line 16(3n) and the first wiring 15(3n) are formed in the first wiring layer L01. Since the capacitor 44 of column (3n) is an inter-wiring capacitor formed between the feed line 16(3n) and the first wiring 15(3n) as described above, the capacitor 44 is formed in the first wiring layer L01.

The second metal layer M02 and the second wiring layer L02 are formed between the circuit layer C01 and the first metal layer M01, and the data line 14(3n) is formed in the second wiring layer L02. Moreover, the first metal layer M01 and the second metal layer M02 are coupled to each other via a relay electrode 160. The first metal layer M01 and the second metal layer M02 are supplied with a common fixed potential (the potential Ve1 in the exemplary embodiment), and the first metal layer M01 and the second metal layer M02 serve as a shielding layer configured to protect the data line 14(3n) from electrostatic noise.

In the exemplary embodiment, the first wiring layer L01 in which the capacitor 44 is formed and the first metal layer M01 are overlaid on the second wiring layer L02 in which the data line 14 to which the pixel circuit 110 is coupled is formed, and thus the capacitor 44 forming a holding capacitor together with the capacitor 41 is formed in the display region 112. In the exemplary embodiment, since the capacitor 41 and the capacitor 44 each serve as a holding capacitor configured to hold the gradation voltage according to the display gradation of the pixel circuit 110, a size of the capacitor 41 can be reduced as compared to an aspect in which the capacitor 44 is not provided, and area of the outer frame region of the display panel 10 can be reduced. Thus, according to the exemplary embodiment, chip area of the portion other than the display region 112 in the electro-optical device 1 can be reduced.

B. Modification Example

Figure 5:
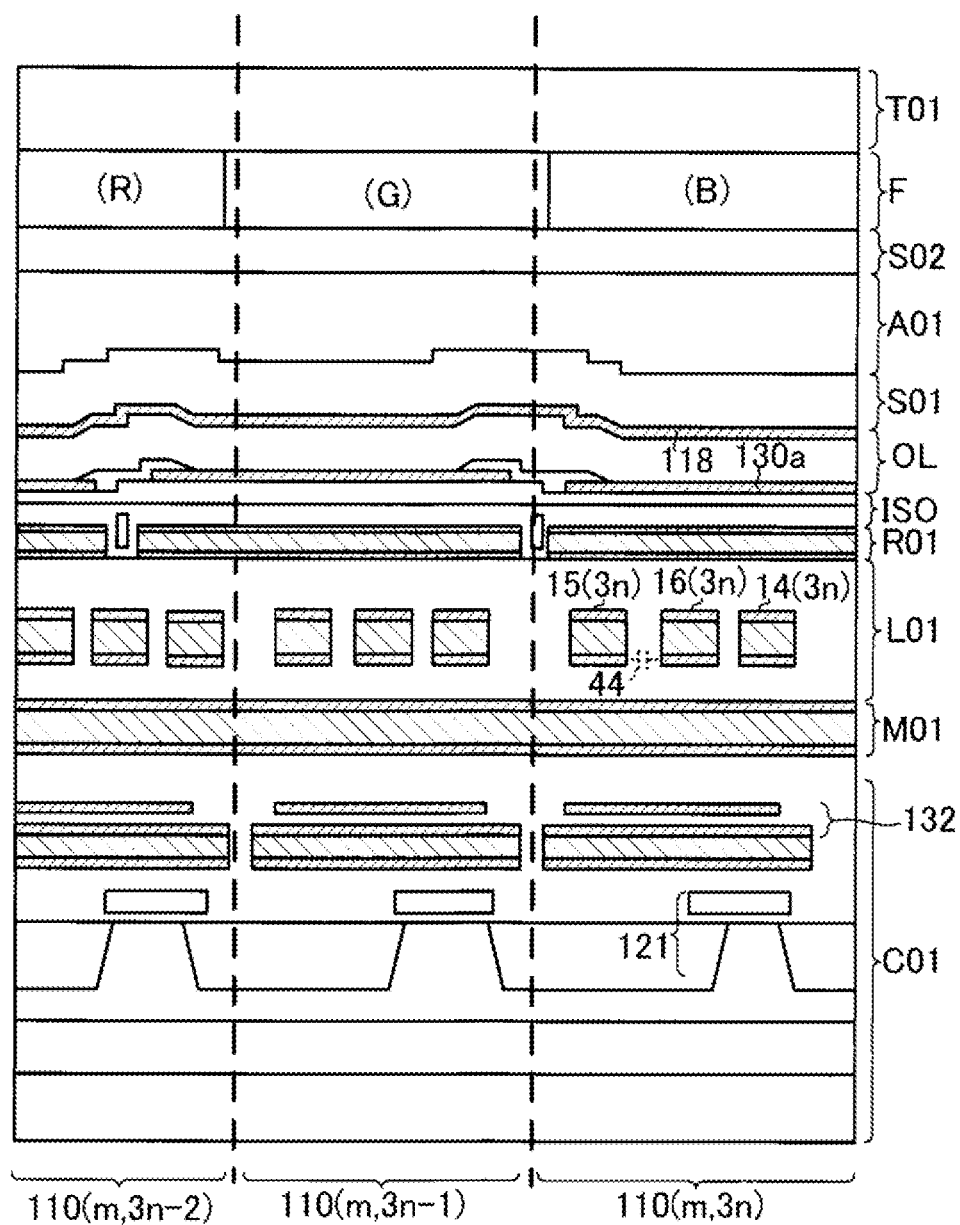
FIG. 5 is a view for explaining Modification Example (1).

Although an exemplary embodiment of the invention is described above, the following modification examples may be added to this exemplary embodiment. (1) In the above exemplary embodiment, the second wiring layer L02 provided with the data line 14(3n) is separately provided from the first wiring layer L01 provided with the feed line 16(3n) and the first wiring 15(3n). However, as illustrated in FIG. 5, a second wiring layer L02 and a second metal layer M02 may be omitted, and a feed line 16(3n), a data line 14(3n), and first wiring 15(3n) may be provided in a first wiring layer L01.

Figure 6:
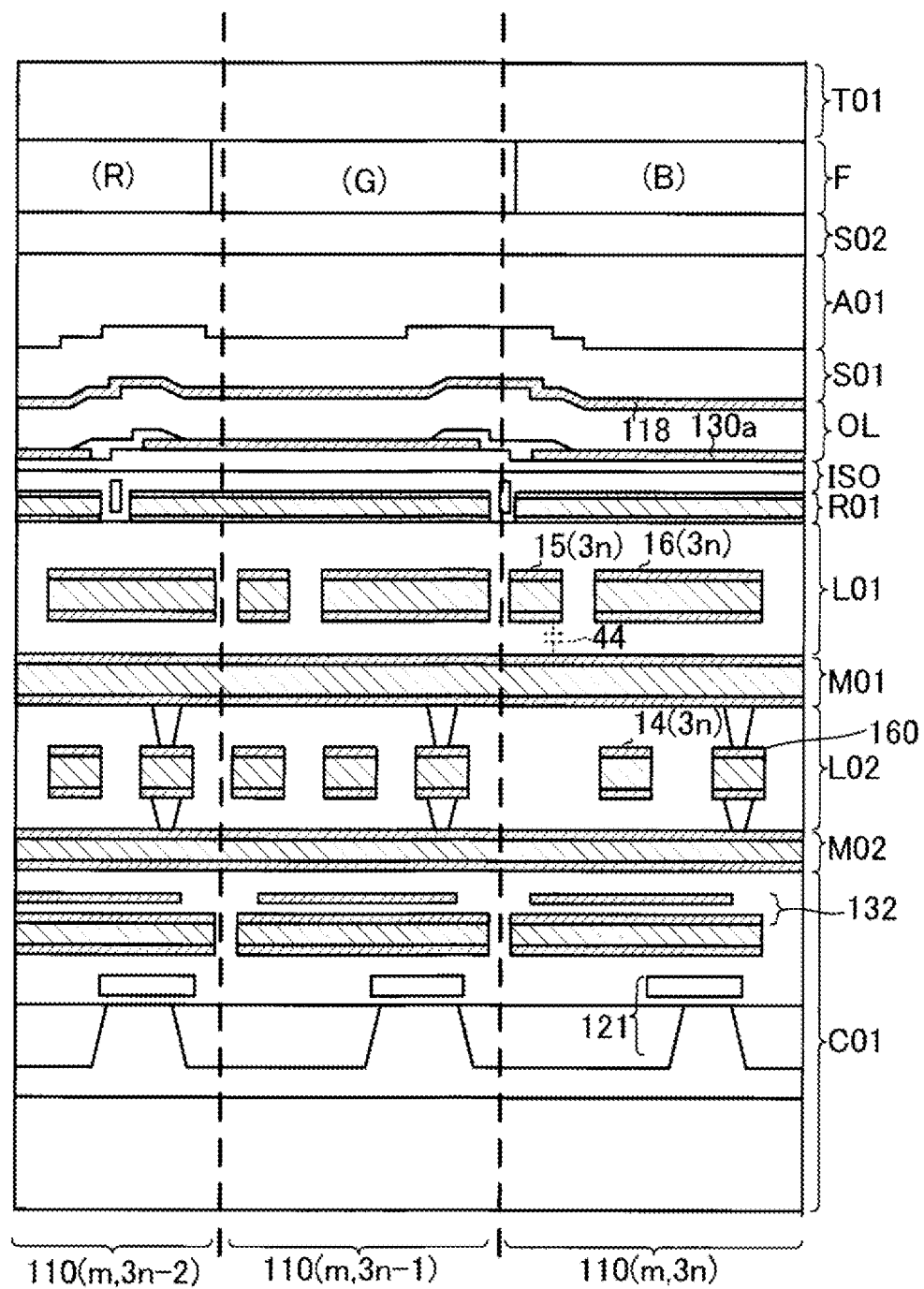
FIG. 6 is a view for explaining Modification Example (2).
Figure 7:
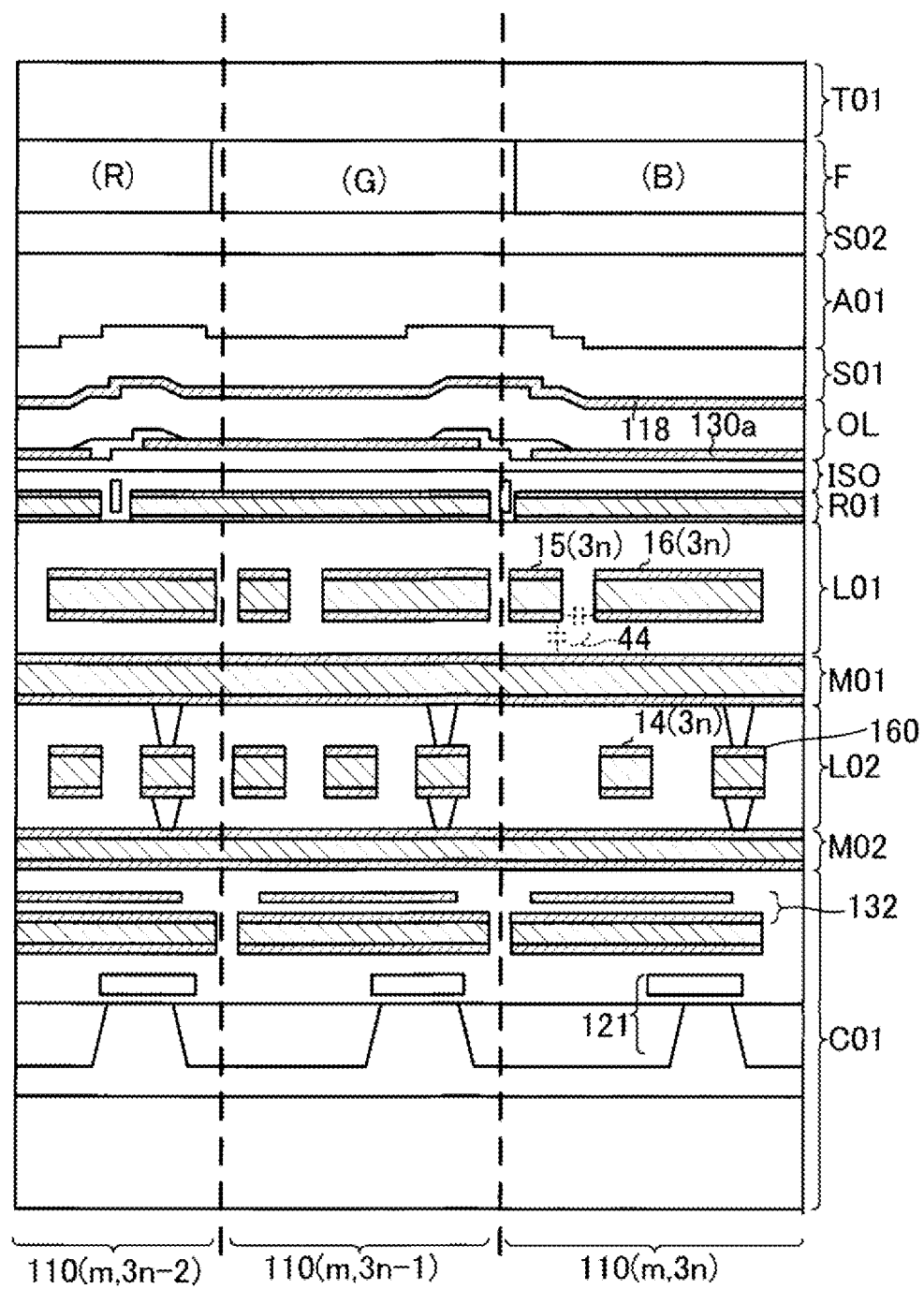
FIG. 7 is a view for explaining Modification Example (2).

(2) In the above exemplary embodiment, the wiring capacitor formed between the feed line 16(3n) and the first wiring 15(3n) serves as the first capacitor. However, as illustrated in FIG. 6, a capacitor formed between a first metal layer M01 and the first wiring 15(3n) may serve as a first capacitor. Moreover, as illustrated in FIG. 7, a wiring capacitor formed between the feed line 16(3n) and the first wiring 15(3n) and a capacitor formed between the first metal layer M01 and the first wiring 15(3n) may each serve as the first capacitor. Moreover, in a case where the first capacitor alone can serve as a holding capacitor, a capacitor 41 may be omitted. That is, the capacitor 41 in the above exemplary embodiment is not an essential constituent element of the electro-optical device of the invention, and can be omitted. When the capacitor 41 is omitted, chip area of a portion other than a display region 112 in an electro-optical device 1 can further be reduced.

Figure 8:
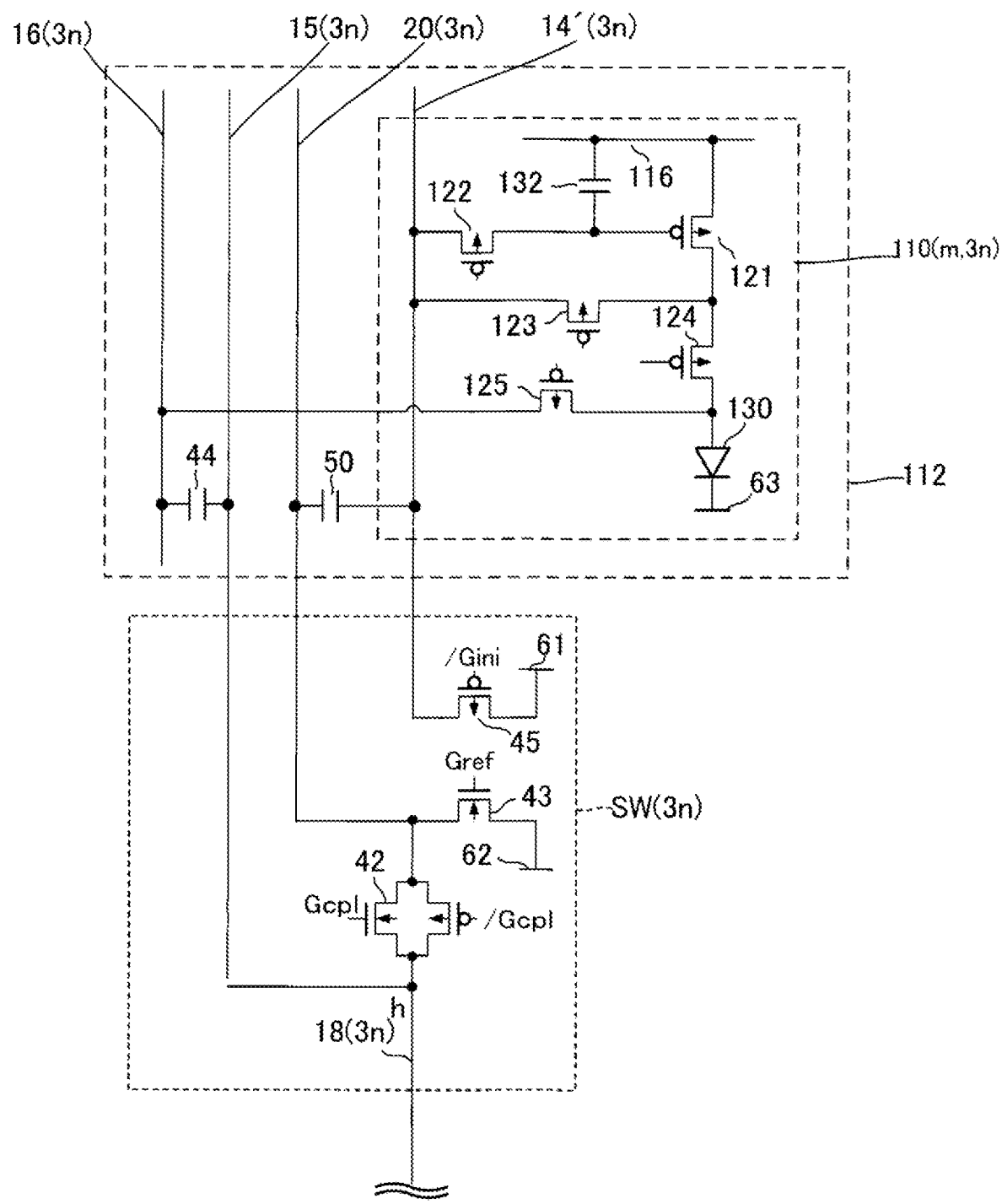
FIG. 8 is a view for explaining Modification Example (3).
Figure 9:
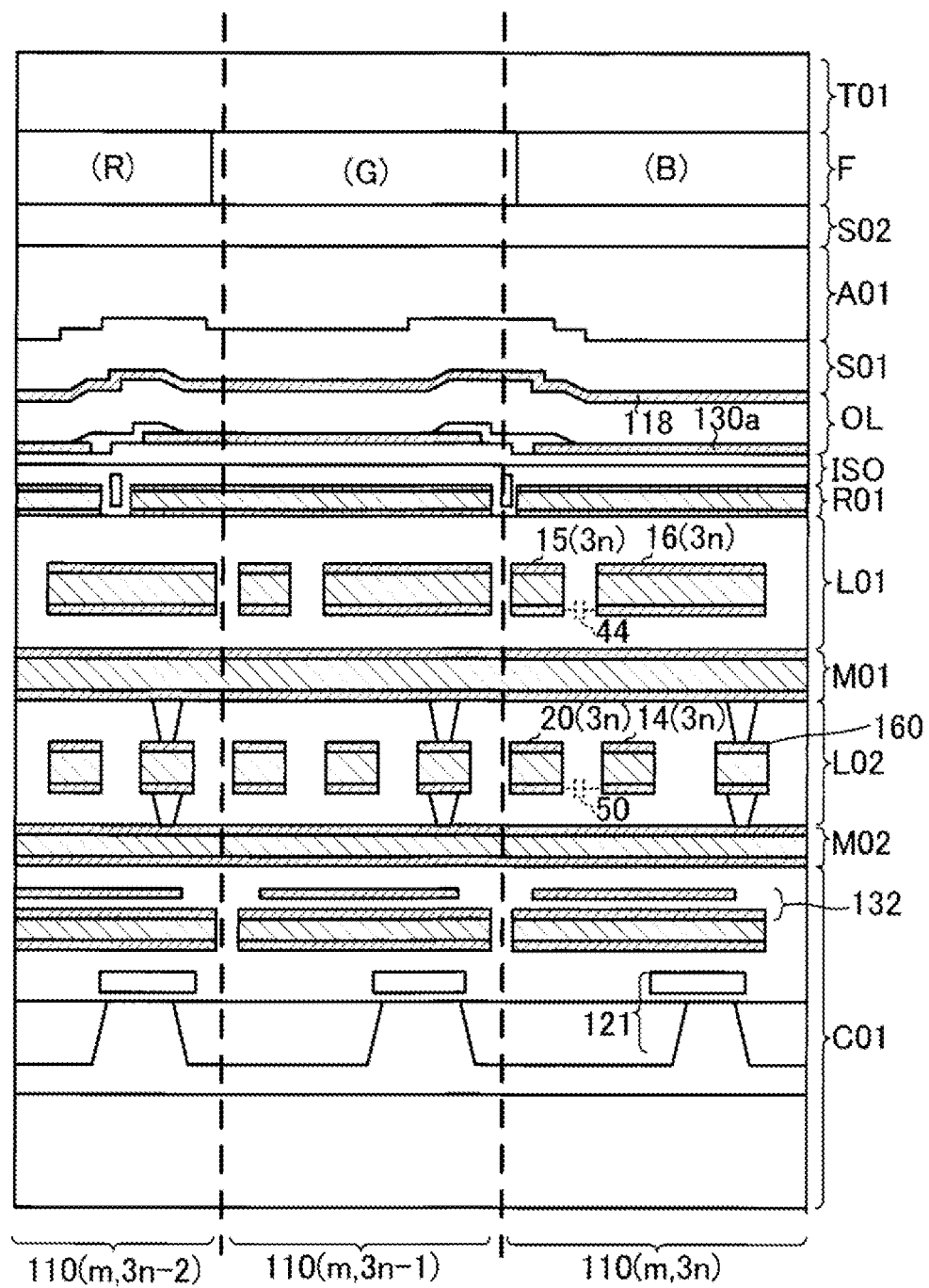
FIG. 9 is a view for explaining Modification Example (3).

(3) As illustrated in FIG. 8, the data line 14(3*n*) in FIG. 3 may be divided into a data line 14'(3*n*) to which a pixel circuit 110 and a transistor 45 are coupled, and second wiring 20(3*n*) to which an output end of a transmission gate 42 and a transistor 43 are coupled, and a capacitor 50 (second capacitor) may be provided between the data line 14'(3*n*) and the second wiring 20(3*n*). This enables the pixel circuit 110 to perform coupling drive by using the capacitor 50 as a transfer capacitor. Moreover, the second wiring 20(3*n*) may be provided in the second wiring layer L02 to extend along the data line 14'(3*n*) (see FIG. 9), and an inter-wiring capacitor formed between the data line 14'(3*n*) and the second wiring 20(3*n*) may serve as the capacitor 50. This enables the transfer capacitor used in the coupling drive to be provided in the display region 112 of a display unit 100, and enables the chip area of the portion other than the display region 112 to be reduced as compared to an aspect in which the transfer capacitor is provided in the portion other than the display region 112.

Figure 10:
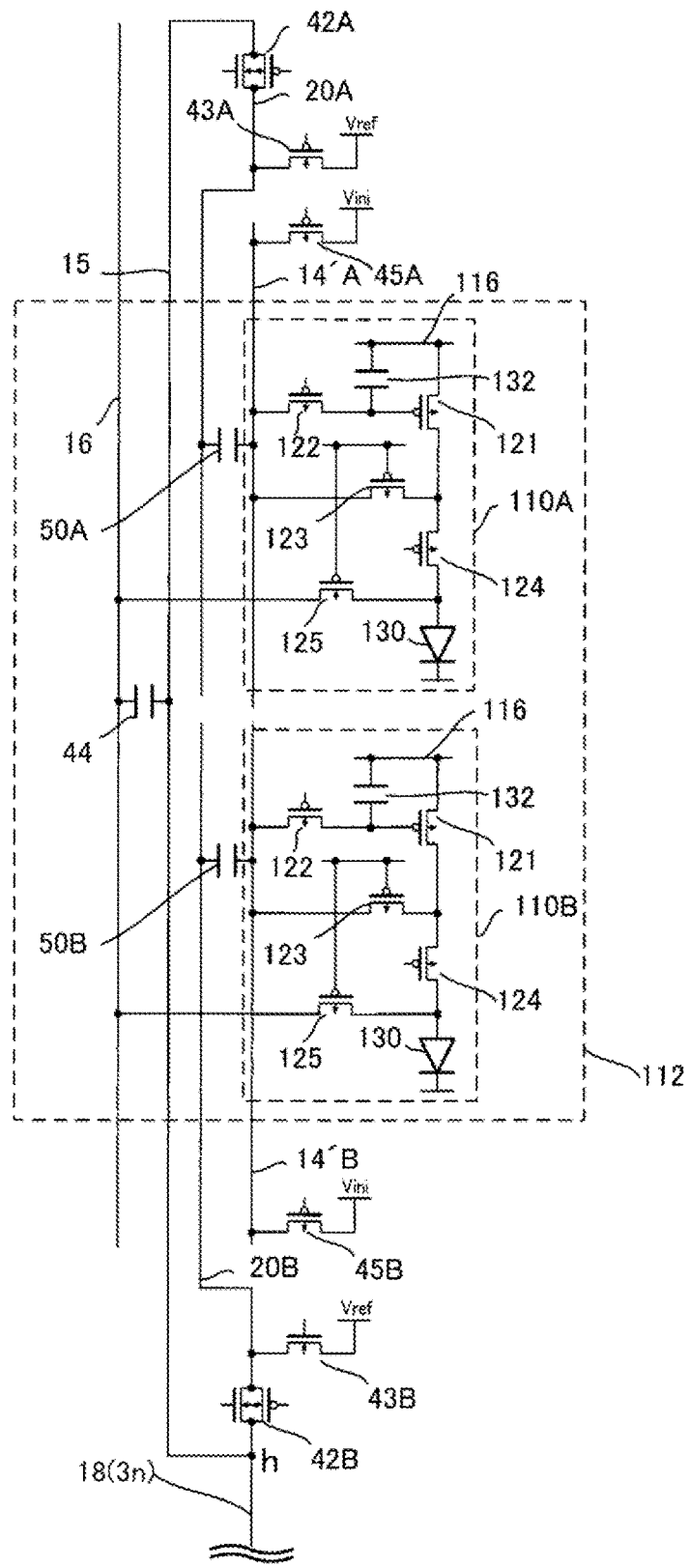
FIG. 10 is view for explaining Modification Example (4).

(4) As illustrated in FIG. 10, a data line 14' in FIG. 8 may be divided vertically into two portions of a data line 14'A provided from a first row to row m, and a data line 14'B provided from row (m+1) to row M, and the second wiring 20 may be divided vertically into two portions of second wiring 20A coupled via a transmission gate 42A to the first wiring 15 and second wiring 20B coupled via a transmission gate 42B to the first wiring 15, as illustrated in FIG. 10. Note that a capacitor 50A in FIG. 10 serves as an inter-wiring capacitor formed between the data line 14'A and the second wiring 20A, and a capacitor 50B in FIG. 10 serves as an inter-wiring capacitor formed between the data line 14'B and the second wiring 20B. Moreover, a transistor 43A in FIG. 10 serves as a transistor configured to switch coupling and decoupling between a reference power supply (voltage generating circuit 31) configured to supply a reference potential Vref and the second wiring 20A. A transistor 43B serves as a transistor configured to switch coupling and decoupling between the second wiring 20B and the above-described reference power supply. A transistor 45A in FIG. 10 is a transistor configured to switch coupling and decoupling between an initialization power supply (voltage generating circuit 31) configured to supply an initialization potential Vini and the data line 14'A. A transistor 45B is a transistor configured to switch coupling and decoupling between the data line 14'B and the initialization power supply.

In the aspect illustrated in FIG. 10, the transmission gate 42A and the transmission gate 42B are switched on and off and thus, a pixel circuit 110A coupled to the data line 14'A and a pixel circuit 110B coupled to the data line 14'B can be driven independently and separately from each other. For example, while the transmission gate 42A is turned on to write a gradation voltage to the pixel circuit 110A, the transmission gate 42B can be turned off and the transistor 43B can be turned on to perform a compensation operation of a threshold voltage for a drive transistor of the pixel circuit 110B. Although a potential of the data line 14'B varies while the compensation operation for the drive transistor of the pixel circuit 110B is executed, the data line 14'A is decoupled from the data line 14'B and thus, no trouble occurs in the writing of the gradation voltage to the pixel circuit 110A. According to the aspect illustrated in FIG. 10, during the writing of the gradation voltage to one of the pixel circuit 110A and the pixel circuit 110B, the compensation operation for the other can be initiated, and a period for executing the compensation operation (compensation period) can be longer than in the related art. Generally, a compensating effect of the threshold voltage increases as the compensation period becomes longer and thus, according to the aspect illustrated in FIG. 10, a size of the portion other than the display region can be reduced, and the compensation effect of the threshold voltage of the drive transistor provided in the pixel circuit can be enhanced, as compared to the related art.

C. Application Example

The electro-optical device according to the exemplary embodiment described above can be applied to various electronic apparatuses, and is particularly suitable for an electronic apparatus required to display a high-definition image of 2K 2K or higher and required to be compact. Hereinafter, an electronic apparatus according to the invention will be described.

Figure 11:
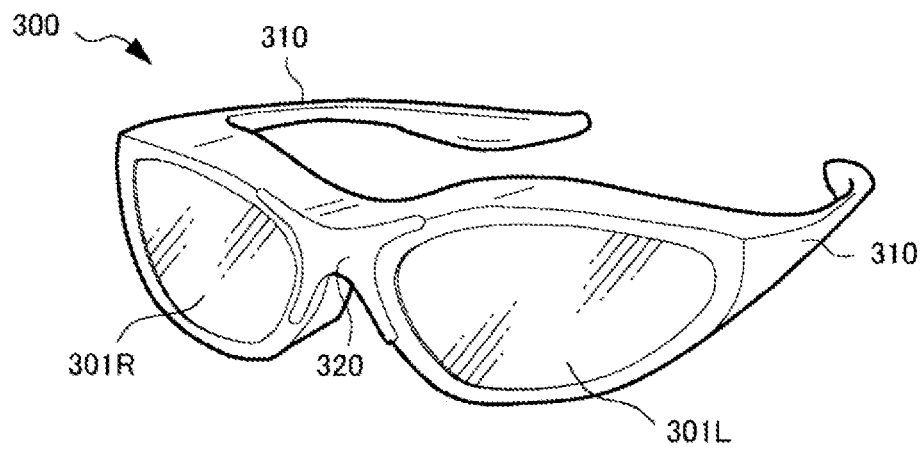
FIG. 11 is a perspective view illustrating a head-mounted display 300 according to the invention.

FIG. 11 is a perspective view illustrating an outer appearance of a head-mounted display 300 as an electronic apparatus employing an electro-optical device of the invention. As illustrated in FIG. 11, the head-mounted display 300 includes a temple 310, a bridge 320, a projection optical system 301L, and a projection optical system 301R. Then, in FIG. 11, an electro-optical device (not illustrated) for a left eye is provided behind the projection optical system 301L, and an electro-optical device (not illustrated) for a right eye is provided behind the projection optical system 301R.

Figure 12:
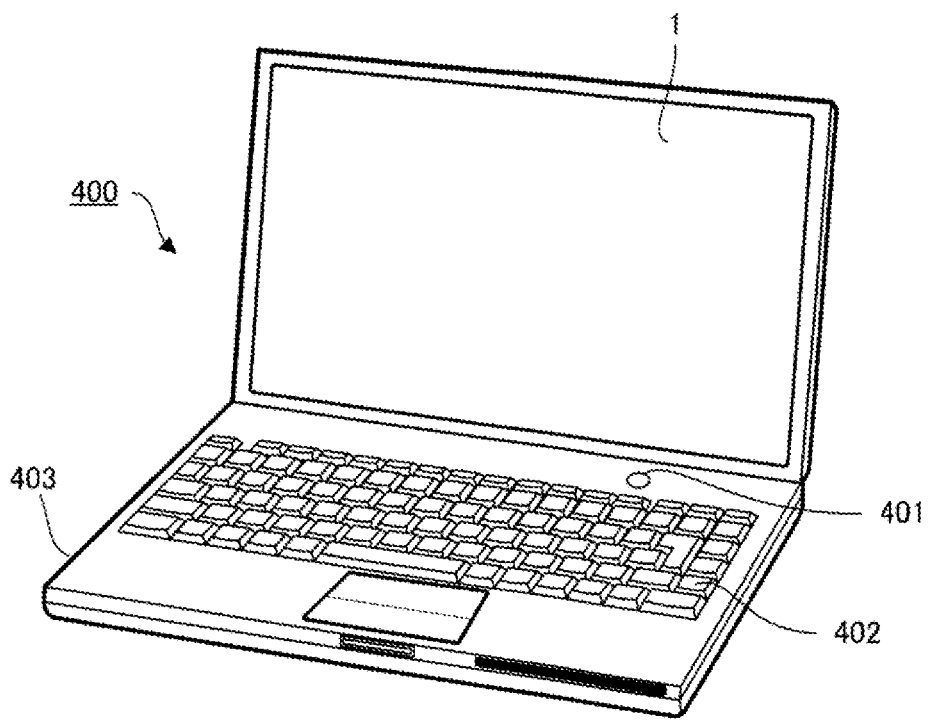
FIG. 12 is a perspective view illustrating a personal computer 400 according to the invention.

FIG. 12 is a perspective view illustrating a personal computer 400 of a portable type employing an electro-optical device 1 according to the invention. The personal computer 400 includes the electro-optical device 1 configured to display various images, and a main body portion 403 provided with a power switch 401 and a keyboard 402. Note that examples of the electronic apparatus to which the electro-optical device 1 according to the invention is applied include, in addition to the apparatuses illustrated in FIG. 11 and FIG. 12, an electronic device disposed close to eyes such as a digital scope, a digital binocular, a digital still camera, and a video camera. Further, the electro-optical device according to the invention can be applied as a display unit provided in an electronic apparatus such as a mobile phone, a smartphone, a personal digital assistant (PDA), a car navigation device, and an automotive display unit (instrument panel).

The entire disclosure of Japanese Patent Application No. 2018-042609, filed Mar. 9, 2018 is expressly incorporated by reference herein.

What is claimed is:
1. An electro-optical device comprising:
a pixel circuit including a light-emitting element and a pixel capacitor;
a data line corresponding to the pixel circuit;
a fixed potential line that is supplied with a fixed potential and that is disposed along the data line in plan view; and
a first wiring that is electrically connected to the data line via a first switching element and that is disposed next to the fixed potential line in plan view, wherein the fixed potential line and the first wiring are disposed in a first layer and configure a first capacitor that holds a gradation voltage according to a display gradation of the pixel circuit, and in plan view, the first capacitor overlaps with the light-emitting element.

2. The electro-optical device according to claim 1, further comprising:

a metal layer that is supplied with the fixed potential and that is disposed in a layer next to the first layer, wherein the first capacitor is formed by the first wiring and the metal layer.

3. The electro-optical device according to claim 2, further comprising:

a second switching element;

a second metal layer that is supplied with the fixed potential and that is disposed in a layer next to a second layer that includes the data line, wherein the first capacitor is electrically connected to the first switching element and the second switching element, a second layer is disposed in a layer between the first metal layer and the second metal layer, and in plan view, a second capacitor formed by the data line and the second metal layer overlaps with the light-emitting element.

4. The electro-optical device according to claim 3, wherein the first switching element is formed of a first transmission gate, and the second switching element is formed of a second transmission gate.

5. The electro-optical device according to claim 2, wherein the first metal layer is disposed in a layer between the first layer and a second layer that includes the data line.

6. An electronic apparatus comprising the electro-optical device according to claim 1.

7. The electro-optical device according to claim 1, wherein the first switching element is formed of a first transmission gate.

8. An electro-optical device comprising:

a pixel circuit including a light-emitting element and a pixel capacitor;

a data line corresponding to the pixel circuit;

a data signal supply circuit that outputs a gradation voltage;

a first switching element having a first end that is electrically connected to the data signal supply circuit and a second end;

a second switching element having a third end that is electrically connected to the data line and a fourth end that is electrically connected to the second end of the first switching element;

a first capacitor that is electrically connected to the second end of the first switching element and the fourth end of the second switching element and that holds the gradation voltage that outputs from the data signal supply circuit, wherein in plan view, the first capacitor overlaps with the light-emitting element.

9. The electro-optical device according to claim 8, further comprising:

a fixed potential line that is supplied with a fixed potential and that is disposed along the data line in plan view; and a first wiring that is electrically connected to the second end of the first switching element and the fourth end of the second switching element and that is disposed next to the fixed potential line in plan view, wherein the fixed potential line and the first wiring are disposed in a first layer and configure the first capacitor.

10. The electro-optical device according to claim 9, further comprising:

a first metal layer that is supplied with the fixed potential and that is disposed in a layer next to the first layer, wherein the first capacitor is formed by the first wiring and the first metal layer.

11. The electro-optical device according to claim 10, further comprising:

a second metal layer that is supplied with the fixed potential and that is disposed in a layer next to a second layer that includes the data line, wherein the second layer is disposed in a layer between the first metal layer and the second metal layer, and in plan view, a second capacitor formed by the data line and the second metal layer overlaps with the light-emitting element.

12. The electro-optical device according to claim 10, wherein the first metal layer is disposed in a layer between the first layer and a second layer that includes the data line.

13. An electronic apparatus comprising the electro-optical device according to claim 8.

14. The electro-optical device according to claim 8, wherein the first switching element is formed of a first transmission gate, and the second switching element is formed of a second transmission gate.

* * * * *